United States Patent
Ninomiya et al.

(10) Patent No.: US 6,954,398 B2
(45) Date of Patent: Oct. 11, 2005

(54) SEMICONDUCTOR MEMORY DEVICE INCLUDING SUBWORD DRIVERS

(75) Inventors: Kouichiro Ninomiya, Kodaira (JP); Isamu Fujii, Kodaira (JP); Hiroki Fujisawa, Tokyo (JP)

(73) Assignees: Elpida Memory, Inc., Tokyo (JP); Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 2 days.

(21) Appl. No.: 10/633,710

(22) Filed: Aug. 5, 2003

(65) Prior Publication Data

US 2004/0156259 A1 Aug. 12, 2004

(30) Foreign Application Priority Data

Aug. 5, 2002 (JP) .................................... 2002-227229

(51) Int. Cl.[7] .............................................. G11C 8/00
(52) U.S. Cl. ........................... 365/230.06; 365/230.03
(58) Field of Search ..................... 365/230.06, 230.03, 365/191

(56) References Cited

U.S. PATENT DOCUMENTS 5,602,796 A * 2/1997 Sugio .................... 365/230.06
6,011,746 A * 1/2000 Oh ........................ 365/230.06
6,111,808 A * 8/2000 Khang et al. ........... 365/230.06
6,721,223 B2 * 4/2004 Matsumoto et al. ......... 365/222

* cited by examiner

*Primary Examiner*—Hoai Ho
(74) *Attorney, Agent, or Firm*—Sughrue Mion, PLLC

(57) ABSTRACT

A semiconductor memory device is capable of performing a faster operation by reducing a load applied to a subword selection line or driving a subword driver provided for each memory mat. In a drive method of subword drivers that are actuated in response to subword selection signals supplied through subword selection lines, the subword selection lines are branched according to the number of memory mats. Each subword selection signal has a polarity to a branching position and an inverted polarity from each branching position to each subword driver. The inverted subword selection signal together with a main word signal are calculated to operation in each subword driver and output as a subword drive signal. The plurality of subword drivers share an inverter circuit for inverting the main word signals so as to permit a simplified circuit configuration.

6 Claims, 4 Drawing Sheets

SEMICONDUCTOR MEMORY DEVICE INCLUDING SUBWORD DRIVERS

BACKGROUND OF THE INVENTION

1. Field of the Invention

The present invention relates to a semiconductor memory device provided with a plurality of memory mats formed by dividing a memory array or a memory block, and subword drivers (SWDs) connected to each memory mat, and a subword driver driving system.

2. Description of the Related Art

Hitherto, as this type of semiconductor memory device, there has been known the dynamic RAM (hereinafter referred to as "DRAM") disclosed in Japanese Unexamined Patent Application Publication No. 9-36328 (JP-A). In the DRAM, the storage area on a chip is divided into a plurality of memory blocks, each memory block being divided into a plurality of memory mats. In this case, each memory mat has a plurality of memory cells. In a DRAM of this type, each memory mat is surrounded by a sense amplifier assembly and a subword driver (SWD) assembly. The sense amplifier assemblies are disposed at the positions where they can be connected to column selection lines and bit lines arranged in the direction of columns. The SWD assemblies are disposed at the positions where they can be connected to main word lines and subword lines arranged in the direction of rows, and include a plurality of SWDs. Providing the SWD assemblies allows the operating storage area to be accommodated in a small area, and makes it possible to reduce power comsumption and to operate at a high speed.

Moreover, each SWD assembly includes a plurality of subword driver circuits, and each subword driver circuit is connected to a main word line and a subword line arranged in the direction of rows, as mentioned above, and also connected to a subword selection line (hereinafter referred to also as an "FX line") that extends from a subword selection decoder. Thus, each subword driver circuit selects a main word line and a subword selection line to selectively activate a subword line so as to activate the memory cell associated with the subword line.

For this type of DRAM, it has been proposed to share a plurality of subword selection lines by a plurality of memory mats. In this case, a driving system may be adopted, in which a subword selection line is disposed between two memory mat arrays disposed in the direction of columns with an interval provided therebetween, and the subword selection line is branched or divided in the direction of arrays to connect them to the subword drivers associated with the memory mats disposed on both sides of the subword selection line. The drivers are driven by subword selection signals on the subword selection line. In this case, subword selection signals (FX signals) are sent from a subword selection decoder to the subword selection line.

As described above, if the FX branching or dividing drive method is adopted, then the capacity of the DRAM and the number of memory mats to be selected by a single subword selection line will inevitably increase. If the number of memory mats increases, as in this case, then the number of the subword driver circuits to be selected by the same subword selection line tends to dramatically increase.

Conventionally, a drive method is adopted such that a subword selection signal (FXT) of a single polarity is sent from a subword selection decoder to each subword selection line. In such a drive method, a delay in operation is inevitably caused to occur between a subword driver circuit near the subword selection decoder and a subword driver circuit far away from the subword selection decoder, as the number of memory mats increases.

There has been proposed another branching drive method in which a subword selection signal of a single polarity from a subword selection decoder is inverted each time it is handed down to another subword driver circuit so as to use two subword selection signals (FXT and FXB) having the positive polarity and the negative polarity, respectively, thus the subword driver circuits are driven.

Using this branching drive method, however, does not solve the problem of the unignorable influences of wiring resistance and load capacitances, as the memory capacity increases. The experiments carried out by the assignee have revealed that an increase in wiring resistance or the like results from an increase in the load imposed by on FXBs of the selection signals increases.

SUMMARY OF THE INVENTION

Accordingly, it is an object of the present invention to provide a semiconductor memory device capable of controlling the influences caused by an increase in load capacitance or wiring resistance due to subword selection lines even if memory mats increase in number as chip sizes or memory capacities increase.

It is another object of the present invention to provide a subword driver driving system that is capable of reducing the delay attributable to subword lines by reducing the load applied to the subword selection lines.

According to one aspect of the present invention, there is provided a semiconductor memory device including subword drivers (SWDs), each of which has a plurality of subword driver circuits commonly connected to a main word line and also connected to different subword selection lines to drive respective subword lines, each of the SWDs being connected to driver input terminals and the subword lines, and a common inverter circuit having an inverter input terminal and an inverter output terminal, the inverter input terminal being connected to the main word line and the inverter output terminal being connected to the plurality of driver input terminals, wherein each of the subword driver circuits includes an internal inverter circuit that is connected to an inverter output terminal connected to the main word line and the subword selection lines and has its output terminal connected to the subword lines, and a drive transistor connected to the subword selection lines, the inverter output terminal and the output terminal of the internal inverter circuit, and each of the subword driver circuits is driven by a subword selection signal received through one of the subword selection lines.

Preferably, the internal inverter circuit is constructed of a PMOS transistor and an NMOS transistor having their gates and drains commonly connected to the main word line. The source of the PMOS transistor is connected to the subword selection lines, and an output of the internal inverter is taken out from the commonly connected drains.

Preferably, the drive transistor is constructed of an NMOS transistor having its drain connected to the subword selection lines, its source connected to the subword lines, and its gate connected to the output terminal of the common inverter circuit.

Preferably, the common inverter circuit is constructed of two transistors.

Preferably, the common inverter circuit and the main word line are shared by four subword driver circuits.

According to another aspect of the present invention, there is provided a subword driver driving system for driving a plurality of subword drivers (SWDs), which are disposed on branched subword selection lines, by issuing subword selection signals represented by FXB(/FX), wherein a plurality of inverters is connected at the branching positions on the subword selection lines to turn the subword selection signals into true subword selection signals expressed by FXT and distribute the true subword selection signals to the plurality of SWDs provided at the branching positions of the subword lines so as to reduce the load applied to the FXB subword selection signals.

Preferably, the SWDs are disposed on both sides with the subword selection lines sandwiched therebetween, and the SWDs on both sides receive the true subword selection signals from the inverter shared by them.

Preferably, the SWD includes a plurality of subword driver circuits and an inverter having an inverter input terminal connected to a main word line and an inverter output terminal, and each of the subword driver circuits is connected to the inverter input terminal and receives the true subword selection signals. Each subword driver circuit further includes an internal inverter circuit that is connected to the subword selection lines for receiving the true subword selection signals and has its output terminal connected to the subword lines, and a drive transistor connected to the subword selections lines to which the true subword selection signals are supplied, the inverter output terminal, and the output terminal of the internal inverter circuit. The subword driver circuit is driven by the true subword selection signals.

DESCRIPTION OF THE PREFERRED EMBODIMENT

Figure 1:
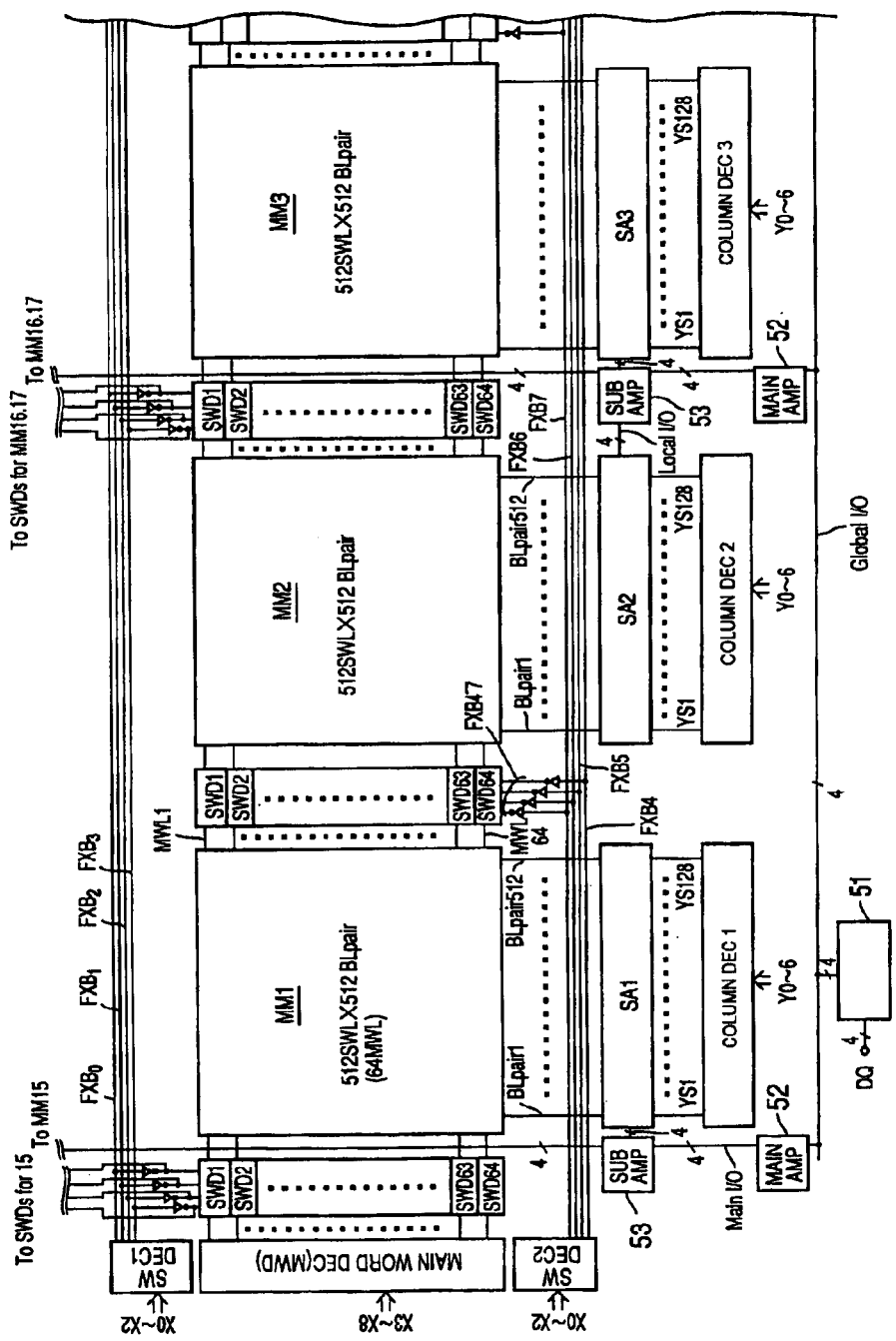
FIG. 1 is a partial view of a semiconductor memory device to which the present invention can be applied.
Figure 2:
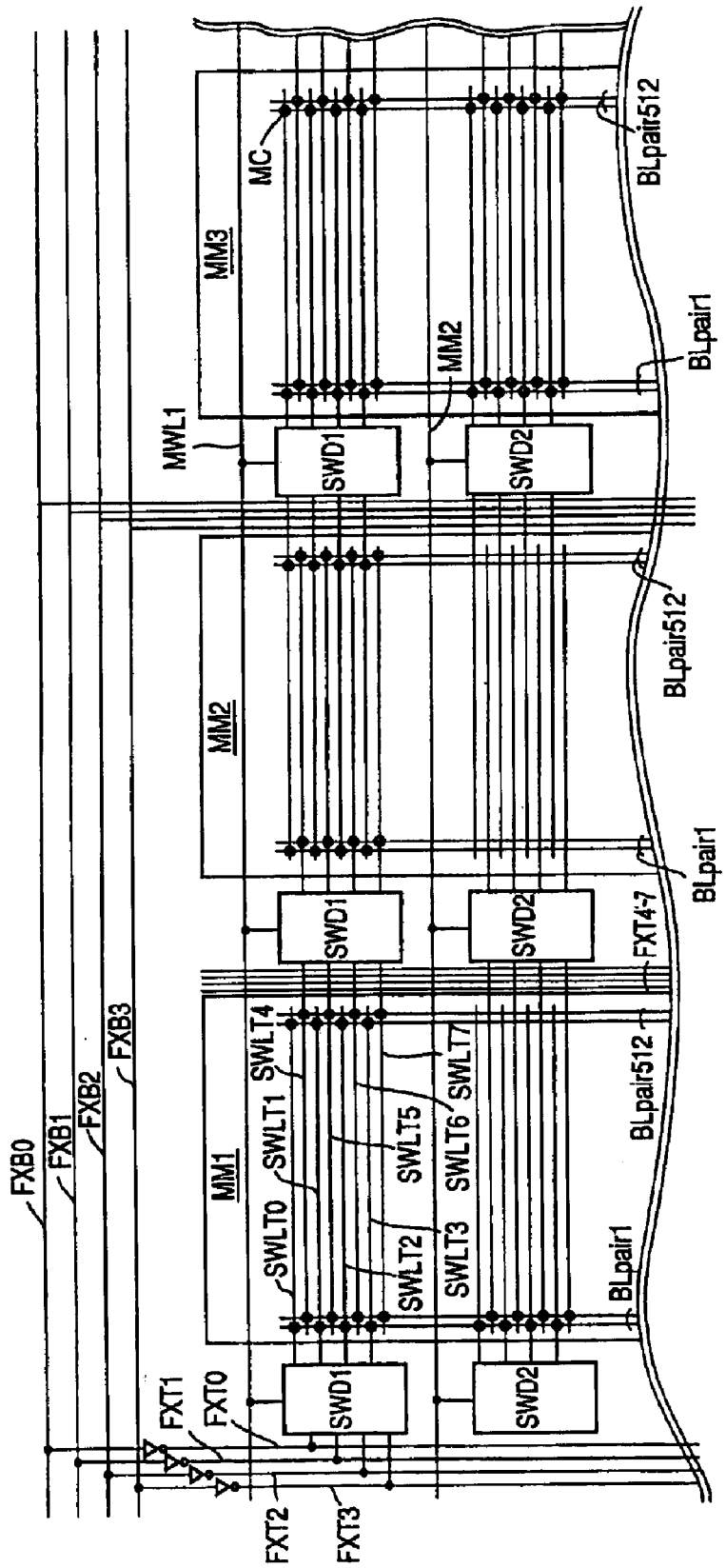
FIG. 2 is a diagram for explaining, in more detail, a part of the semiconductor memory device shown in FIG. 1.

Referring to FIGS. 1 and 2, a semiconductor memory device to which the present invention can be applied will be explained. FIG. 1 shows a part of a DRAM as the semiconductor memory device. The DRAM practically includes memory mats MM1 through MM28 disposed in two arrays. The semiconductor memory device shown in the diagram has fourteen similar memory mats MM, namely, MM1 through MM14, in a direction of arranging the memory mats MM1 through MM3 shown in the diagram. The semiconductor memory device further has another array of memory mats MM15 through MM28 disposed in parallel to the memory mats MM1 through MM14. FIG. 1 shows only the memory mats MM1 through MM3 out of the memory mats MM1 through MM28. Each of the memory mats MM1 through MM28 has a memory capacity of 256 Kbits. For this reason, each of the memory mats MM11 through MM28 has 512 subword lines (SWLs) extending in the direction of rows and 512 bit pair lines extending in the direction of columns. Each of the memory mats MM1 through MM28 can be independently set in an active state by memory mat selection signals (not shown).

The semiconductor memory device shown in the diagram has an I/O circuit 51 connected to an I/O terminal DQ (4-bit), and main amplifiers 52 connected to the I/O circuit 51 through global I/O lines. The main amplifiers 52 are connected to sub-amplifiers 53 through main I/O lines. Column decoders DEC1 through DEC3 associated with the memory mats MM1 through MM3 are provided in the vicinity of the memory mats MM1 through MM3. Column address signals Y0 through Y6 are applied to the columns DEC1 through DEC3. Furthermore, the columns DEC1 through DEC3 are connected to sense amplifier assemblies SA1 through SA3.

In the example illustrated, each of the columns DEC1 through DEC3 is capable of selecting 128 YS lines. When one YS line is selected, four sense amplifiers among the sense amplifier assemblies SA1 through SA3 are selected. As a result, of the 512 bit pair lines, four bit pair lines BL are connected to the main amplifier 52 through the intermediary of the sub-amplifier 53. The sub-amplifiers connected to the sense amplifier assemblies SA1, SA2 and SA3 are also connected to the sub-amplifiers of the memory mats MM15, MM16 and MM17 that belong to another row, which is not shown.

The semiconductor memory device is further provided with a main word decoder (MWD) and two sub word decoders (SWDEC1 and SWDEC2) to select the 512 SWLs of the memory mats MM1 through MM14 and MM15 through MM28. The MWD is assigned 6 bits, namely, X3 through X8 bits, among X address signals, while SWDEC1 and SWDEC2 are assigned 3 bits, namely, X0 through X2 bits. In this configuration, the MWD is connected to the SWDs 1 through 64 of the memory mats MM through the 64 MWLs.

In this case, each of the SWD1 through SWD64 includes four subword driver circuits. The subword driver circuits are selected by the outputs of the subword decoders SWDEC1 or SWDEC2. More specifically, when one of the 64 MWLs is selected and rendered active by the MWD, one of the SWD1 through SWD64 is activated. At this time, one subword driver circuit among SWD1 through SWD64 is activated by the SWDEC1 or SWDEC2 or X0 to X2.

To be more specific, the SWDEC1 is connected to the SWDs 1 through 64 of the memory mat MM1 through the intermediary of four subword selection lines and four inverters. In this example, the four subword selection lines and the four inverters are connected also to the SWD1 through SWD64 of the associated memory mats MM15 (not shown) among the memory mats arranged in parallel to the memory mats MM1. The four subword selection lines receive subword selection signals FXB0, FXB1, FXB2 and FXB3 from the SWDEC1. These subword selection signals FXB0, FXB1, FXB2 and FXB3 set one of the four subword driver circuits in the SWD of the memory mats MM1 or MM15 to the active state. The subword selection signals FXB0, FXB1, FXB2 and FXB3 are supplied also to SWD1 through SWD64 provided between the memory mats MM2 and MM3 and between the memory mats MM16 and MM17 (not shown) through the intermediary of inverters.

The SWDEC2, which is activated upon receipt of X0 to X2, as in the case of SWDECD1, is connected to the SWD1 through SWD64 provided between the memory mats MM1 and MM2 through the intermediary of the subword selection lines and the inverters and also connected to the SWD1 through SWD64 provided between the memory mats MM3 and MM4 (not shown). Subword selection signals FXB4 through FXB7 are output to the subword selection lines from the SWDEC2 and supplied through inverters to the SWD1 through SWD64 disposed between the memory mats MMs at every other MMs.

In other words, the subword selection lines from the SWDEC1 or SWDEC2 are connected via the inverters to the SWD1 through SWD64 arranged at every other memory mats MMs.

In the configuration, eight subword driver circuits in the two SWDs can be selected and driven by the subword selection signals FX0 through FX7 generated by the three bits, X0 through X2.

FIG. 2 shows more details of the connection relationship between the SWDs and the memory mats MMs shown in FIG. 1. Referring to FIG. 2, subword selection signals FXB0 through FXB3 are inverted by the inverters into FXT0 through FXT3, which are supplied to the SWD1 disposed on the lefthand side to the memory mat MM1. Furthermore, FXT4 through FXT7 from the SWDEC2 are supplied to the SWD1 located on the righthand side to the memory mat MM1, that is, between the memory mats MM1 and MM2. The SWLs of the memory mat MM1 are also selected by the latter SWD1. As a result, in response to the aforementioned FXT0 through FXT7, the SWDs1 disposed on both sides of the memory mat MM1 sets one of the subword drive signals SWLT0 through SWLT7 to an active state.

Figure 3:
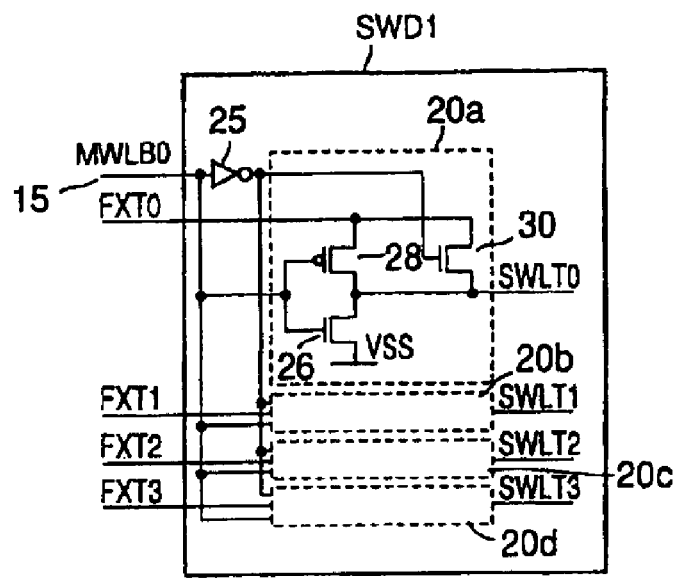
FIG. 3 is a circuit diagram of a subword driver (SWD) according to an embodiment of the present invention.

Referring now to FIG. 3, the SWDs that can be used in the present invention will be explained, taking SWD1 shown in FIGS. 1 and 2 as an example. The SWD1 shown in FIG. 3 has four subword driver circuits 20a, 20b, 20c and 20d that are arranged in the direction of columns in FIG. 3 and commonly connected to a main word line (MWL) 15. In the shown example, an MWL selection signal MWLB is supplied on the MWL, and the MWL selection signal MWLB is commonly supplied to the four subword driver circuits 20a, 20b, 20c and 20d, and also supplied to an inverter circuit 25 shared by the four subword driver circuits 20a, 20b, 20c and 20d. Thus, the inverter circuit 25 has an input terminal to which the MWL selection signal MWLB is supplied, and an inverter output terminal connected to the subword driver circuits 20a, 20b, 20c and 20d.

Upon receipt of the MWL selection signal MWLB and the subword selection signals FXT0 through FXT3, the subword driver circuits 20a, 20b, 20c and 20d perform an operation to output subword drive signals SWLT0 through SWLT3 onto the SWLs. The subword driver circuits 20a, 20b, 20c and 20d all share the same configurations and operations; therefore, the description will be given by taking the subword driver circuit 20a as the representative.

As is obvious from FIG. 3, the subword driver circuit 20a receives a true MWL selection signal (MWLT), which is obtained by inverting the MWL selection signal MWLB by the inverter circuit 25, and the true subword selection signal FTX0, then outputs the subword drive signal SWLT0 onto the SWL. The subword driver circuit 20a has an internal inverter circuit constructed of an NMOS transistor 26 and a PMOS transistor 28, and a drive NMOS transistor 30 connected to the output terminal of the internal inverter circuit.

The internal inverter circuit is constructed of CMOS transistors, namely, the NMOS and PMOS transistors 26 and 28, the gates and the drains of the two transistors being commonly connected. The commonly connected drains are connected to the output terminal of the subword driver circuit 20a. The true subword selection signal FXT0 is applied to the source of the PMOS transistor 28. The source of the NMOS transistor 26 is connected to the power terminal of Vss (ground potential).

The true MWL selection signal MWLT from the output terminal of the inverter circuit 25 is supplied to the gate of the drive NMOS transistor 30. The source of the transistor 30 being connected to the output terminal of subword driver circuit 20a, and the drain thereof is connected to the subword selection line. Thus, the true subword selection signal FXT0 is supplied to the drain of the drive NMOS transistor 30.

As described above, each of the subword driver circuits 20a through 20d is structured by three transistors, and the inverter circuit 25 is structured by two transistors, as in the case of the internal inverter circuit. The inverter circuit 25 is provided for each of the four subword driver circuits 20a through 20d. This means that each of the subword driver circuits 20a through 20d is structured by 3.5 transistors; therefore, the subword driver circuits 20a through 20d may be referred to as 3.5-transistor subword driver circuits.

Figure 4:
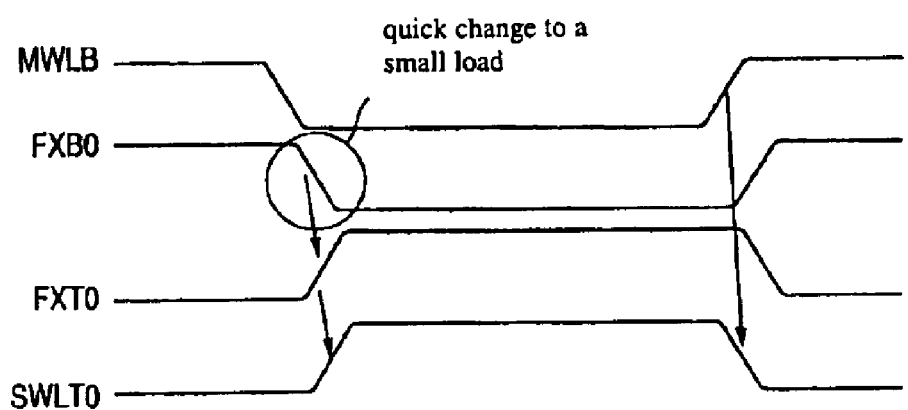
FIG. 4 is a waveform diagram for explaining the operation of the SWD shown in FIG. 3.

Referring now also to FIG. 4, the operation of the subword driver circuit 20a shown in FIG. 3 will be explained. It is assumed that the MWL 15 has been selected by the MWD and the subword selection line decoder SWDEC1 or SWDEC2 shown in FIG. 1, and the subword selection signal FXB0 of the low level has been issued from the SWDEC1. In this state, the MWL selection signal MWLB is switched to the low level, while the subword selection signal FXT0, which is the inverter output of FXB0 shown in FIG. 1 is switched to high level, as shown in FIG. 4. This applies to the remaining subword selection signals FXB1 through FXB7. At this time, the load applied to the subword selection signals FXB0 through FXB7 is relatively small, allowing the status switching of the subword selection signals FXB0 through FXB7 to be quickly accomplished.

As the subword selection signals FXB0 through FXB7 are switched from one state to another state, the inverters (refer to FIGS. 1 and 2) 25 provided at the branching positions of the subword selection signals FXB0 through FXB7 are also switched at a high sped from one state to another state to output the true subword selection signal FXT0 of the high level, as shown by FXT0 in FIG. 3.

When the MWL selection signal MWLB switches to the low level, as shown in FIG. 4, then the output of the inverter circuit 25 shown in FIG. 3 switches to the high level, causing the drive NMOS transistor 30 to turn ON. On the other hand, the MWL selection signal MWLB of the low level is applied to the gates of the NMOS and PMOS transistors 26 and 28, respectively, which forms the internal inverter circuit. As a result, causing the PMOS transistor 28 is turned ON. Thus, if the PMOS transistor 28 and the drive NMOS transistor 30 is turned ON, then a high-level subword drive signal SWLT0 is output onto the subword line, as illustrated in FIG. 4.

If the MWL selection signal MWLB is put on the low level, and the subword selection signal FXT0 is put on the low level, then the drive NMOS transistor 30 remains OFF. This maintains the low level state of the SWL.

If the MWL selection signal MWLB is at the high level, and the subword selection signal FXT0 is at the high level, then the NMOS transistor 26 turns ON, causing the output of the subword driver circuit 20a to be set at the ground potential (Vss). If the subword selection signal FXT0 switches to the low level while the MWL selection signal MWLB is at the high level, the NMOS transistor 26 turns ON, and the output of the subword driver circuit 20a is maintained at the ground potential.

As described above, it is understood that the subword driver circuit 20a shown in FIG. 3 issues the high-level subword drive signal SWLT0 only if a main word selection line and a subword selection line are selected. In the example explained above, the description has been given of only FXT0, while the same operation is performed for the remaining subword selection signals FXT1, FXT2 and FXT3. One of the subword driver circuits 20a through 20d of SWD1 is selected, and the subword drive signal SWLT1, SWLT2 or SWLT3 is selectively output onto a subword selection line of a memory mat.

In the example, the four subword driver circuits are provided with the same inverter circuits. Alternatively, however, more subword driver circuits may be provided with the same inverter circuits.

Figure 5:
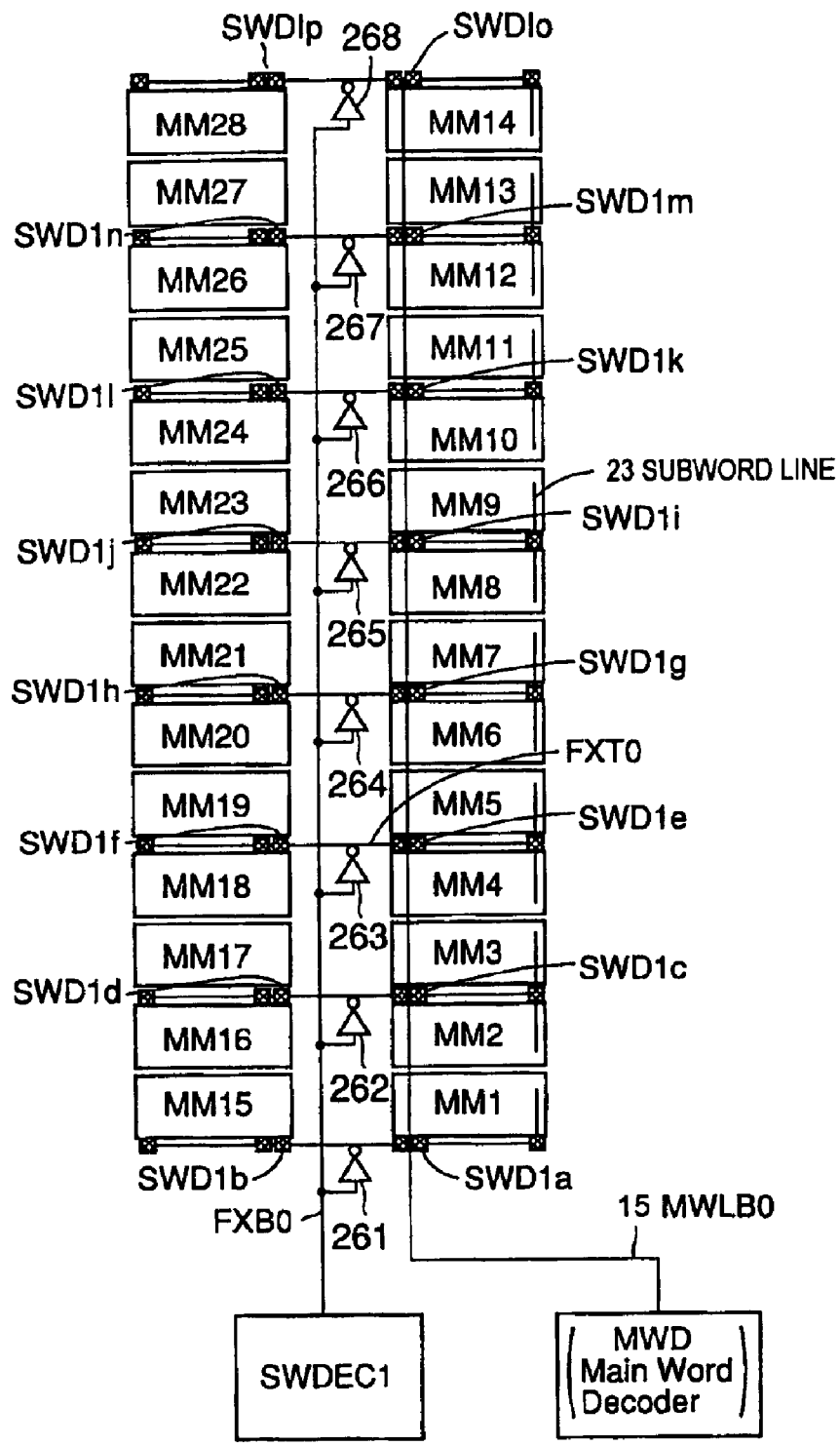
FIG. 5 shows a part of the layout of the semiconductor memory device to which the SWD driving system according to an embodiment of the present invention can be applied.

Referring now to FIG. 5, the entire construction of the semiconductor memory device including the SWDs in accordance with the present invention will be schematically explained. For the sake of clarity of the explanation, FIG. 5 shows only the MWL selection signal MWLB0 and the components related to a single subword selection signal FXB0 among the subword selection signals. Hence, the entire configuration of the memory mats related to the subword selection signal FXB0 is shown. In this case, the direction in which the MWL extends is referred to as the direction of rows, MWLB0 being supplied to the MWL. Two rows of memory mats are disposed along the MWL 15 with a space provided between the two rows, each row including fourteen memory mats MMs. The memory mats MMs are numbered from 1 through 28 in FIG. 5.

Comparing FIG. 5 with FIG. 1 makes it obvious that the MWL selection signal MWLB0 is supplied from the MWD to one row of memory mats MM1 through MM14, as shown in FIG. 1. Furthermore, as in the case shown in FIG. 1, the subword selection signal FXB0 is output from the SWDEC1 and supplied to subword drivers SWD1a and SWD1b of the opposing memory mats MM1 and MM15, respectively, through the intermediary of an inverter 261. Similarly, the subword selection signal FXB0 is supplied to SWD1c provided between the memory mats MM2 and MM3 and to SWD1d provided between the memory mats MM16 and MM17 through the intermediary of an inverter 262. In the similar fashion, subword drivers SWD1e through SWD1p are provided among memory mats or at the end portions of the memory mats, and the subword selection signal FXB0 is supplied in the form of FXT0 to the SWD1e through SWD1p via inverters 263 through 268. Each of the subword drivers SWD1a through SWD1p shown in FIG. 5 has the circuit configuration shown in FIG. 3.

FIG. 5 shows only one SWD1 of each memory mat MM together with the single subword selection line and the selection signal FXB0. As shown in FIG. 1, however, the SWDs related to the remaining subword selection signals FXB1 through FXB7 also have the same connections, which are all omitted for the clarity of the diagram.

As shown in FIG. 5, the subword selection line extends from the SWDEC1 and is connected to the SWDs via the inverters 261 through 268. In other words, the subword selection line has the portion that extends in parallel to the MWL, i.e., the portion that extends along the rows, and a portion that extends between the inverters 261 through 268 and the memory mats MMs, i.e., in the direction of columns. The portions of the subword selection line extending in the direction of columns are branched toward both sides at the branching positions of the SWD1's. Thus, the subword selection line 21 is branched along the MWL 15, i.e., in the direction of rows, and extends also in the direction of columns.

In the example, when the subword selection signal FXB0 is supplied to the subword selection line, the subword selection signal FXB0 is inverted by the inverters 261 through 268 provided at the branching positions and supplied as FXT0 to the SWD1's. As a result, the subword selection signal represented by FXT0 is supplied to the two SWD1's in paired memory mats MMs.

The subword selection signal represented by FXB0 is supplied to the portions of the subword selection line in the direction of rows except for the branching portions, while only the inverted subword selection signal represented by FXT0 is supplied to the SWD1's in the direction of columns from the branching positions. Hence, in this example, only FXT0 is supplied to each SWD1, and FXB0 is not supplied. This means that only FXB0 or FXT0 is supplied, so that the load applied to the signal lines will be reduced, permitting the operation to be performed at a higher speed than in the case where all SWD1's are driven.

It may be possible to drive the SWD1a through SWD1p by using both FXT0 and FXB0. This, however, would disadvantageously complicate the wiring of the SWD1a through SWD1p because the subword selection signals that are mutually complementary would be supplied to the SWD1a through SWD1p. Furthermore, if both FXT0 and FXB0 were used, then one of the subword selection signals would be supplied to all the subword driver circuits through the wiring that extends not only in the direction of rows but in the direction of columns also. This would result in longer wiring for transmitting the subword selection signals, leading to higher wiring resistance and larger load capacitance. This trend is intensified as the memory size increases, so that it would lead to significant restrictions on the chip sizes and the number of divided memory arrays.

Taking the above into account, the subword driver driving system in accordance with the embodiment of the present invention shown in FIG. 5 uses both FXT0 and FXB0 as the subword selection signals, and the portions to be driven by the these signals are separated. This arrangement makes it possible to reduce the load applied to FXT0 and FXB0.

Although the above description has been given only of FXT0 and FXB0, the same circuit configuration is required for the remaining subword selection signals shown in FIG. 1. This indicates a marked advantage of the present invention.

Actually, the example illustrated in FIG. 5 has proven that the capacity value can be reduced to half or less, specifically, from 3000 fF to about 1400 fF, as compared with the case where both FXT0 and FXB0 are used as the subword selection signals in a semiconductor memory device having the same layout.

The characteristics of the construction described above will be summarized. The plurality of subword driver circuits (SWDs) is disposed on the branched subword selection lines. At the positions where the subword selection lines are branched, the inverters are connected to turn the FXB subword selection signals into the FXT true subword selection signals, and the true subword selection signals are distributed to the plural SWDs provided on both sides at the branching positions of the subword line. With this arrangement, the subword selection lines are divided into the ones driven by the FXB subword selection signals and the ones driven by the FXT subword selection signals. Thus, the load applied to FXB and FXT can be reduced.

In the present invention, the subword selection signals are separated into the FXB and FXT signals, and the entire circuit is divided into the portion energized by the FXB signals and the portion energized by the FXT signals. This arrangement scatters the load applied to each signal, so that the overall load capacitance and resistance can be reduced, thus permitting the driving system to be achieved, whereby the subword drivers can be driven at a higher speed. Moreover, since the present invention permits load to be controlled, allowing the semiconductor memory device to accommodate a larger memory capacity and an increased number of divided arrays.

What is claimed is:

1. A semiconductor memory device comprising:

subword drivers (SWDs), each of which has a plurality of subword driver circuits commonly connected to a main word line and also connected to different subword selection lines to drive respective subword lines, each of the SWDs being connected to driver input terminals and the subword lines; and a common inverter circuit having an inverter input terminal and an inverter output terminal, the inverter input terminal being connected to the main word line and the inverter output terminal being connected to the plurality of driver input terminals, wherein each of the subword driver circuits includes an internal inverter circuit that is connected to an inverter output terminal connected to the main word line and the subword selection lines and has its output terminal connected to the subword lines, and a drive transistor connected to the subword selection lines, the inverter output terminal and the output terminal of the internal inverter circuit, and each of the subword drive circuits is driven by a subword selection signal received through one of the subword selection lines.

2. The semiconductor memory device according to claim 1, wherein the internal inverter circuit is constructed of a PMOS transistor and an NMOS transistor having their gates and drains commonly connected to the main word line, and the source of the PMOS transistor is structured to the subword selection lines, and an output of the internal inverter is taken out from the commonly connected drains.

3. The semiconductor memory device according to claim 2, wherein the drive transistor is structured by an NMOS transistor having a drain connected to the subword selection lines, a source connected to the subword lines, and a gate connected to the output terminal of the common inverter circuit.

4. The semiconductor memory device according to claim 1, wherein the common inverter circuit is structured by two transistors.

5. The semiconductor memory device according to claim 4, wherein the common inverter circuit and the main word line are shared by four subword driver circuits.

6. The semiconductor memory device according to claim 1, wherein said common inverter circuit is common to said plurality of subword driver circuits, and an occupied area in the semiconductor memory device is reduced.

* * * * *